(12) United States Patent
Clark

(10) Patent No.: US 7,593,048 B2
(45) Date of Patent: Sep. 22, 2009

(54) METHOD AND APPARATUS FOR SATURATION DETECTION AND ELECTRONIC SHUTTER IN A SOLID STATE IMAGE SENSOR

(75) Inventor: Lawrence T. Clark, Phoenix, AZ (US)

(73) Assignee: Marvell International Ltd., Hamilton (BM)

( * ) Notice: Subject to any disclaimer, the term of this patent is extended or adjusted under 35 U.S.C. 154(b) by 1219 days.

(21) Appl. No.: 10/307,132

(22) Filed: Nov. 27, 2002

(65) Prior Publication Data
US 2003/0112351 A1   Jun. 19, 2003

Related U.S. Application Data

(62) Division of application No. 09/032,175, filed on Feb. 27, 1998, now Pat. No. 6,529,241.

(51) Int. Cl.
H04N 3/14   (2006.01)
H04N 5/238   (2006.01)

(52) U.S. Cl. .................... 348/297; 348/364
(58) Field of Classification Search ......... 348/297, 348/364
See application file for complete search history.

(56) References Cited

U.S. PATENT DOCUMENTS

| | | | |
|---|---|---|---|
| 5,182,447 A | 1/1993 | Nakayama | |
| 5,406,332 A | 4/1995 | Shinohara et al. | |
| 5,444,004 A | 8/1995 | Jang | |
| 5,587,596 A | 12/1996 | Chi et al. | |
| 5,872,596 A * | 2/1999 | Yanai et al. | 348/297 |
| 6,088,058 A * | 7/2000 | Mead et al. | 348/296 |
| 6,130,713 A * | 10/2000 | Merrill | 348/308 |
| 6,133,107 A | 10/2000 | Menegoli | |
| 6,529,241 B1 * | 3/2003 | Clark | 348/308 |

* cited by examiner

Primary Examiner—Justin P Misleh

(57) ABSTRACT

Imaging system having a sensor array with photocells that permit the monitoring of light levels while the sensor is exposed to a scene, and the ability to accurately avoid saturation on a per column, row, or array basis. The sensor array supports variable dynamic range by allowing variable integration times for different columns or rows of the array, thereby improving image quality of a scene in which there are both strong and weak light areas. In one embodiment, the photocell includes a parasitic multi-emitter bipolar junction transistor (BJT) acting as a photodetector. The parasitic device is part of a saturation detection circuit and also supports an electronic shutter mechanism. The parasitic BJT also permits increased sensitivity over some previous CMOS approaches. The photocell design is also spatially efficient, using in one embodiment only four MOSFETs in addition to the parasitic BJT. The embodiments of the invention are particularly useful in CMOS active pixel sensors used in imaging systems such as the digital camera.

13 Claims, 6 Drawing Sheets

METHOD AND APPARATUS FOR SATURATION DETECTION AND ELECTRONIC SHUTTER IN A SOLID STATE IMAGE SENSOR

This application is a divisional of Ser. No. 09/032,175, U.S. Pat. No. 6,529,241, filed on Feb. 27, 1998.

BACKGROUND

This invention is generally related to analog signal processing and more particularly to imaging sensors.

Electronic sensors that respond to incident electromagnetic radiation such as light are used in a wide range of applications, from the simple infrared photodetector used in home security systems to complex medical imaging applications. Such sensors provide electrical signals in relation to the energy incident on the sensor. One particular type of sensor is the imaging sensor used for capturing images of objects or scenes from which light energy has been reflected. Such sensors are found in consumer products such as video cameras, scanners, copiers, and, more recently, digital cameras which provide images in a computer-readable format.

A typical imaging sensor is a circuit composed of a number of active semiconductor photocells usually arranged as an array. Examples include the complimentary metal oxide semiconductor (CMOS) active pixel sensor (APS). Each photocell of an imaging sensor has a photodetector and associated control and readout circuitry (including active devices such as transistors). Photogenerated charge in the cell causes a signal to be generated that is a measure of the energy that was incident on the cell. The cell may also feature a saturation limiting circuit which can be used to limit the response of the photocell to the incident energy, and/or an electronic shutter facility which can capture a signal representing the detected incident energy at a specific time.

After the array has been exposed to the object or scene and incident energy has been detected, the signals from the individual cells of the array are collected and may be converted to digital format. This digital image data represents the image that was formed on the sensor array. The digital image data can then be manipulated and displayed using known signal and image processing techniques to yield a desired image size and quality.

One of the problems encountered with imaging sensors is saturation. Saturation occurs when one or more cells in the sensor have been exposed to too much incident energy in view of its dynamic range, i.e., ability to respond faithfully to changes in incident energy. When saturated, the cell output changes too little or not at all in response to more incident energy. An example of the effect of saturation is seen in images as very bright or almost white regions which correspond to saturated cells in the sensor array.

Saturation can be avoided by controlling an electronic shutter circuit in each photocell to limit the total energy detected by the photocell. Some cells provide a signal that represents the instantaneous detected energy and is controlled by the electronic shutter. The signal is integrated over a time interval known as the exposure or integration interval to obtain the total energy. Saturation is avoided in such cells by reducing the integration interval and by controlling the electronic shutter to prevent the signal from reaching a saturation level.

To help determine the proper interval in such imaging systems, a light level test of the scene may be conducted prior to obtaining an image of the scene. During the light level test, the sensor array is exposed to the scene to identify those cells which are receiving strong light and are therefore saturated. Thereafter, the integration intervals for those cells are reduced, and the array is again exposed to the same scene but with the reduced integration times. Lowering the integration interval lowers the amount of incident energy that is detected by the photocell. In a perfect imaging system, the integration times are adjusted so that the cells are allowed to detect the incident energy up to the dynamic range without saturating any cells.

However, the above technique requires the user or the imaging system to guess at the optimum integration interval that avoids saturation yet maximizes dynamic range for the affected photocells. If the integration interval is reduced too much, then dynamic range is reduced as the photocell may still be able to accurately detect more incident energy; if the integration interval is not reduced enough, the photocells can still saturate. Also, taking multiple exposures of the same scene as required by the above technique may prove to be too slow for rapid frame rate applications such as movies.

Therefore, a better technique of preventing saturation in photocells and sensor arrays is desirable that helps maximize dynamic range. Such a technique should also be capable of integration with the manufacture of other electronic circuits, such as those built using standard metal oxide semiconductor (MOS) fabrication processes that are typically used to implement digital functions. In addition, the novel photocell design should be compact to allow improved manufacturing yields in large and dense sensor arrays.

BRIEF DESCRIPTION OF THE DRAWINGS

These and other features as well as advantages of the different embodiments of the invention will be apparent by referring to the drawings, detailed description and claims below, where:

DETAILED DESCRIPTION

As briefly summarized above, an embodiment of the invention is directed at a photocell that can help peripheral circuitry detect a near saturation condition of the photocell while the cell is measuring incident energy. The peripheral circuitry can be configured to stop integration and therefore avoid saturation of the photocell while at the same time take advantage of the cell's full dynamic range. The photocell has a photodetecting device with two electrical contacts, one of which is used for saturation detection and the other is coupled to a sample node that supports an electronic shutter mechanism. When implemented using a standard MOS fabrication process, the detecting device is a multi-emitter parasitic bipolar junction transistor (BJT). In that embodiment, the photocell also makes efficient use of transistors with only four MOS devices, including an optional one for the storage capacitance associated with the electronic shutter mechanism, in addition to the photodetecting device being the parasitic BJT.

The novel cell can be used as part of a sensor IC in a variety of imaging applications to improve the final image quality by avoiding saturation yet taking advantage of the full dynamic range of a cell, and improve manufacturability by keeping the sensor IC compact using relatively inexpensive CMOS fabrication techniques.

The sensor cells in an array (as part of a sensor IC) may be monitored for saturation on a per column or row basis. The integration intervals may also be controlled on a per column or per row basis. If the sensor array is exposed to a scene having strongly lit areas, the photocells in a column or row detecting those areas will tend to saturate before the rest of the scene has been adequately detected. The embodiments of the invention allow the row or column receiving strong light to be identified, its saturation to be prevented by ending integration for the affected row or column, and simultaneously continuing to integrate other rows or columns that received low light. This allows a more accurate image of the scene, closer to one obtainable from a perfect imaging system, to be captured in which both low and strong light areas are represented free of saturation effects and using a single exposure.

Operation of the various embodiments of the invention will be explained using a MOS implementation of the circuits. The following short cuts are used in this disclosure to describe various operating regions of the MOS field effect transistor (FET). A FET is said to be "turned off" when $V_{GS}$ (gate-source voltage)<$V_T$ (threshold voltage for the device and the device is operating in the cut-off region where its channel, to a first order, acts as an open circuit. When a FET is "turned on", $V_{GS}$>$V_T$, $V_{DS}$ (drain-source voltage) is normally small and the device is operating in the non-saturation region. In certain cases, the FET is also deemed to be turned on when conducting in its linear or saturation regions.

Figure 1:
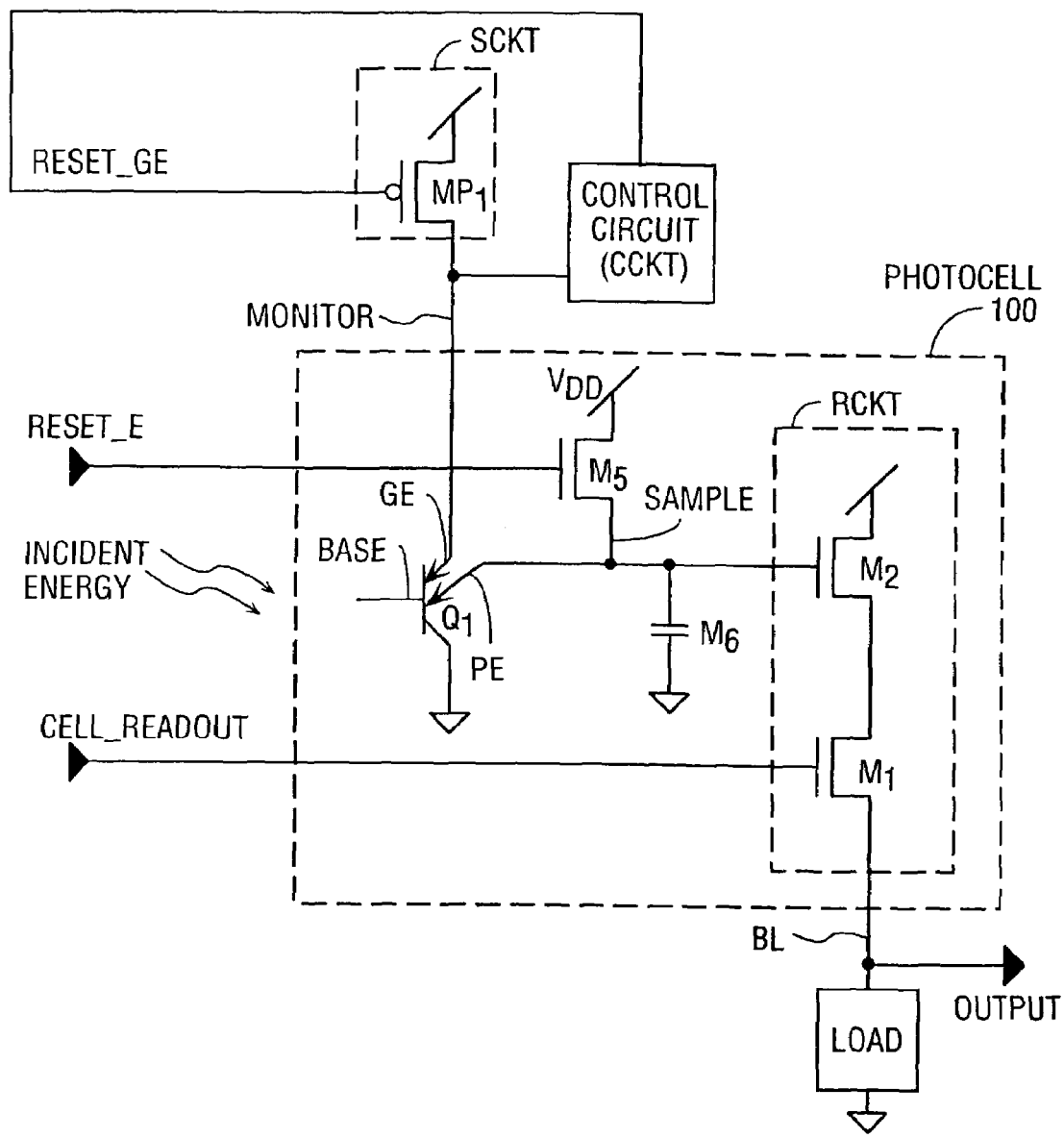
FIG. 1 illustrates a photocell according to an embodiment of the invention.
Figure 2:
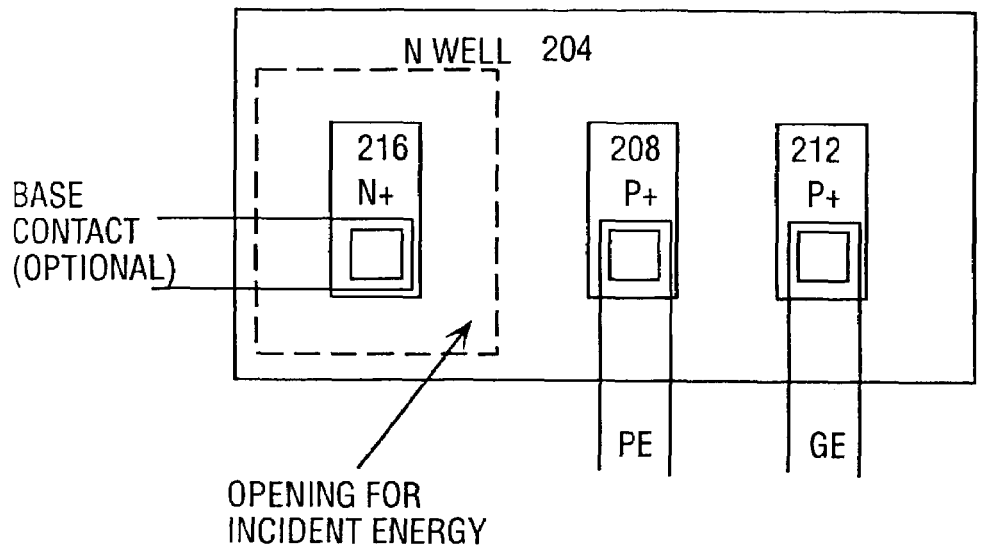
FIG. 2 is a top view of a portion of the photocell implemented using an n-well semiconductor fabrication process according to yet another embodiment of the invention.
Figure 3:
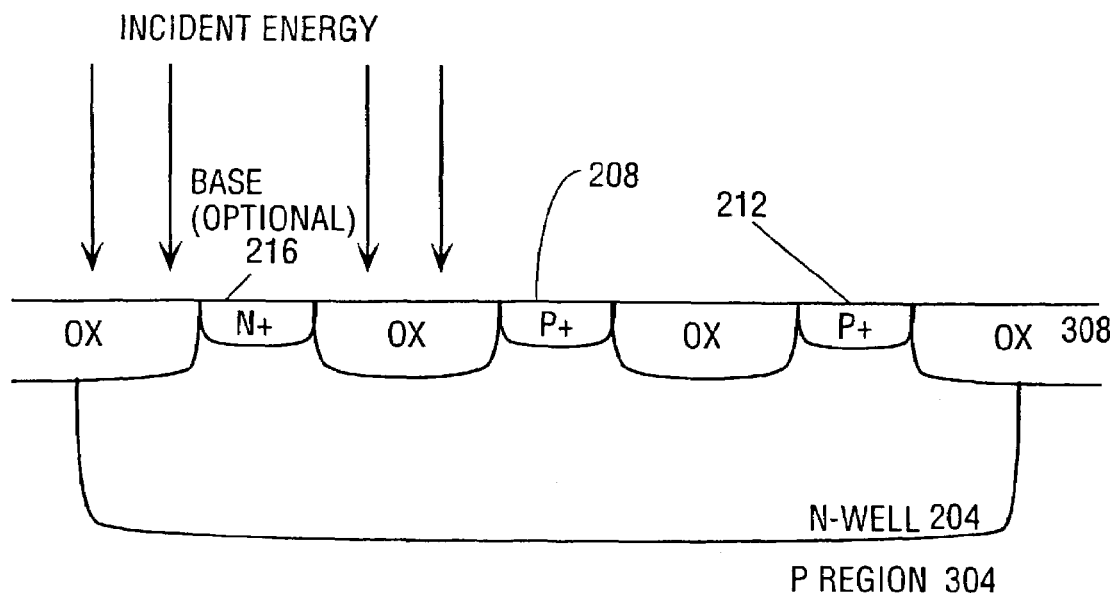
FIG. 3 is a cross section view of the semiconductor structure of FIG. 2.

FIG. 1 illustrates an embodiment of the invention as a sensor 100. The figure illustrates the photocell in terms of a circuit schematic featuring a BJT $Q_1$ that operates as a photodetector. In a particular embodiment, the photocell 100 is implemented using a standard logic complimentary MOS (CMOS) fabrication process in which $Q_1$ is a PNP parasitic device built using a single n-well with highly doped p+ regions (such as implants) that may correspond to an unrealized MOSFET extending over portions of the n-well 204. Thus, $Q_1$ is realizable with a conventional CMOS process rather than a more expensive Bipolar-CMOS (Bi-CMOS). The p+ regions 208 and 212 are connected to electrical contacts that form the global emitter (GE) and pixel emitter (PE) contacts shown in FIG. 1. A top view of $Q_1$ in this embodiment is illustrated in FIG. 2, while FIG. 3 shows $Q_1$, being a parasitic PNP device, by way of cross section. It can be seen that the p-region 304 forms part of the collector of $Q_1$, the n-well 204 forming part of the base, and the p+ regions 208 and 212 forming the multiple emitters.

The device $Q_1$ in one embodiment operates as a photodetector by having a translucent opening above the n-well (the field oxide 308 is translucent) as shown for incident light to pass through and enter the n-well. Portions of the n-well 204 and the well 204-to-substrate 304 junction of $Q_1$ form the photosensitive portion of the device. The response of $Q_1$ to incident light may be tailored using various MOSFET source/drain implants for the 208 and 212 regions. This may be useful as a CMOS salicided process may be used, where the silicide (not shown) that covers the 208, 212 and optionally 216 regions is opaque (to a first order) to light. In addition to using different implants, a silicide blocking mask may be used to increase the opening for incident light.

As part of the photocell 100, the device $Q_1$ is a multiple emitter parasitic transistor, where a first emitter PE is coupled to a storage device $M_6$ and a transistor $M_5$ at a "SAMPLE" node. Sensitivity to incident light is enhanced over a MOS-only implementation of the cell, because the gain_of the parasitic BJT is greater than one. $M_6$ provides capacitance large enough to hold the charge to that which is needed to obtain a desired dynamic range for the photocell given the leakage currents through SAMPLE and given the speed with which circuitry external to the photocell 100 can read the output voltage at node "BL". However, $M_6$ may be eliminated if the leakage at SAMPLE is small enough and the node otherwise exhibits enough parasitic capacitance to hold a signal level until the output voltage is read. The output may be read after asserting Cell_Readout.

$M_5$ operates as a reset transistor to pull SAMPLE up to a value at or near the rail voltage, a so-called reset value. $M_5$ receives a signal Reset_E which, in one embodiment, is designed to overdrive the gate of $M_5$ with a signal that is sufficiently above $V_{DD}$ so that SAMPLE is pulled up to a value that is as close as possible to the rail voltage $V_{DD}$. This helps overcome the body-effect of the n-channel transistor M5 which otherwise may prevent SAMPLE from reaching $V_{DD}$. Pulling sample up to $V_{DD}$ increases the dynamic range of the photocell by providing a higher reset value at SAMPLE at the start of the integration interval.

Also connected to SAMPLE is a readout circuit RCKT that provides the photocell's output signal. The function of RCKT and the load device at BL is to drive BL when the cell has been selected in response to a signal Cell-Readout. RCKT in the embodiment of FIG. 1 includes a transistor $M_2$ operating as a source follower and an output select pass gate RCKT transistor $M_1$. In response to the external signal Cell_Readout, RCKT provides an output signal across the load device at BL. To reduce the physical size of the photocell, RCKT is kept simple and the load device is outside the photocell. However, other readout circuit configurations and loads are possible and may be developed by those skilled in the art.

Figure 6:
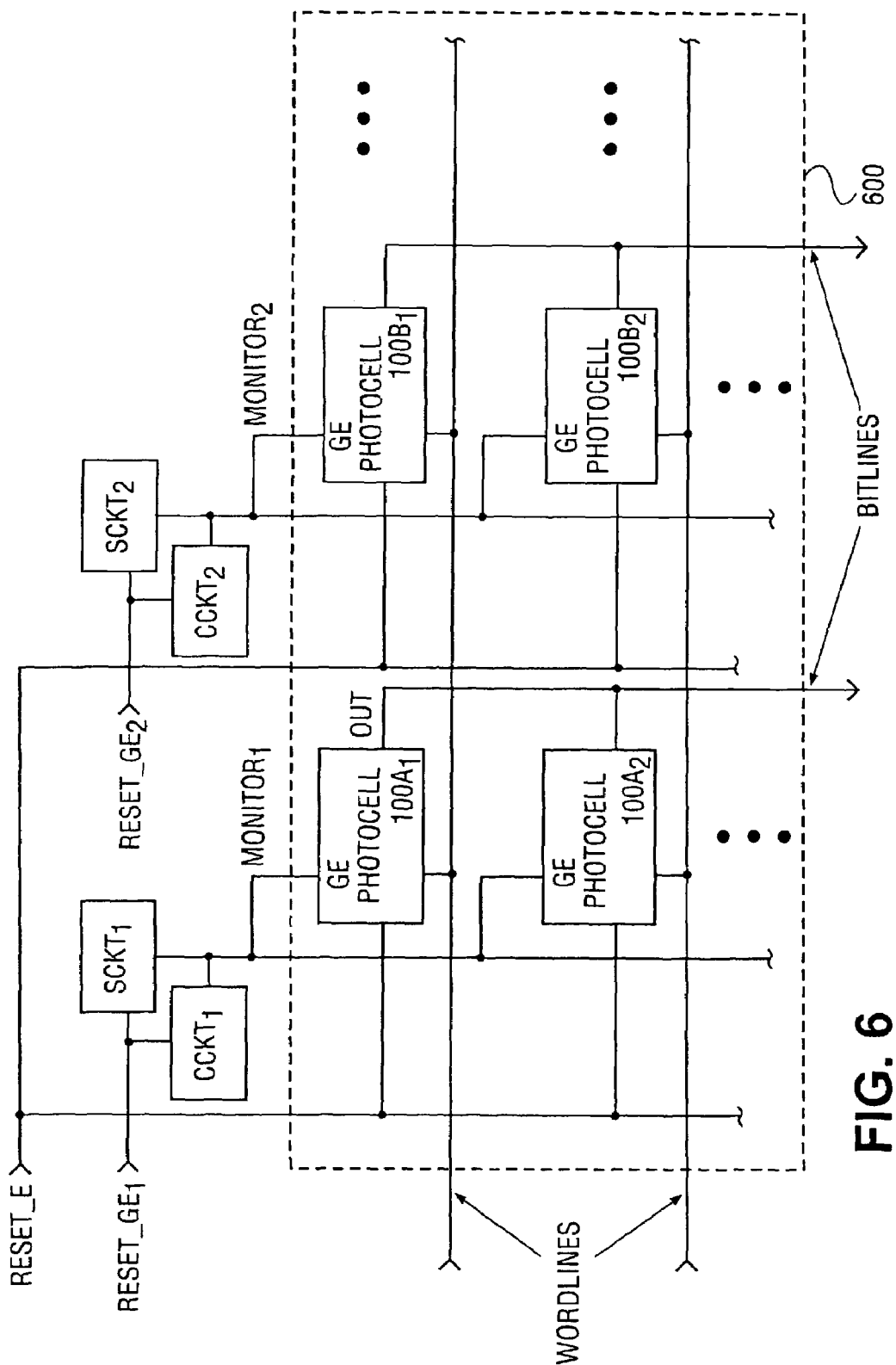
FIG. 6 illustrates a sensor array according to another embodiment of the invention.

Returning now to the device $Q_1$, its second emitter contact GE is connected to a "MONITOR" node which in turn is connected to a stop circuit SCKT and a number of GE contacts in other identical cells, shown collectively as cells $100A_1$, $100A_2$, . . . in FIG. 6. As explained below, the voltage at MONITOR will follow the lowest GE voltage from all other connected cells, and represents the cell which is approaching saturation the quickest.

The stop circuit SCKT in this embodiment includes a single transistor $MP_1$ that provides a load to the emitter GE of $Q_1$ and receives a Reset_GE signal which turns it on and off. The Reset_GE signal when asserted turns $MP_1$ on thereby pulling MONITOR up to a voltage close to the rail. Other configurations are possible for SCKT which provide a suitable load to GE as well as pull MONITOR to a voltage sufficiently high to cut off collector current through $Q_1$.

A control circuit CCKT is coupled between MONITOR and SCKT. In one embodiment, CCKT asserts Reset_GE when MONITOR has reached a predetermined level. This indicates that one of the cells connected to MONITOR is approaching saturation. Asserting Reset_GE in turn pulls the base of each $Q_1$ in the connected cells up to a voltage at or near the rail, thereby reverse biasing the PE junctions in each $Q_1$. This, as explained further below, causes the last value at SAMPLE in each cell to be captured in each cell.

In the embodiment of FIG. 1, $Q_1$ is shown as having a base that is floating. However, an n+ region 216 may optionally be added over the n-well 204 together with a base contact, as shown in FIGS. 2 and 3, if needed for biasing $Q_1$. Biasing circuits known to those skilled in the art may be attached to the base contact.

Figure 4:
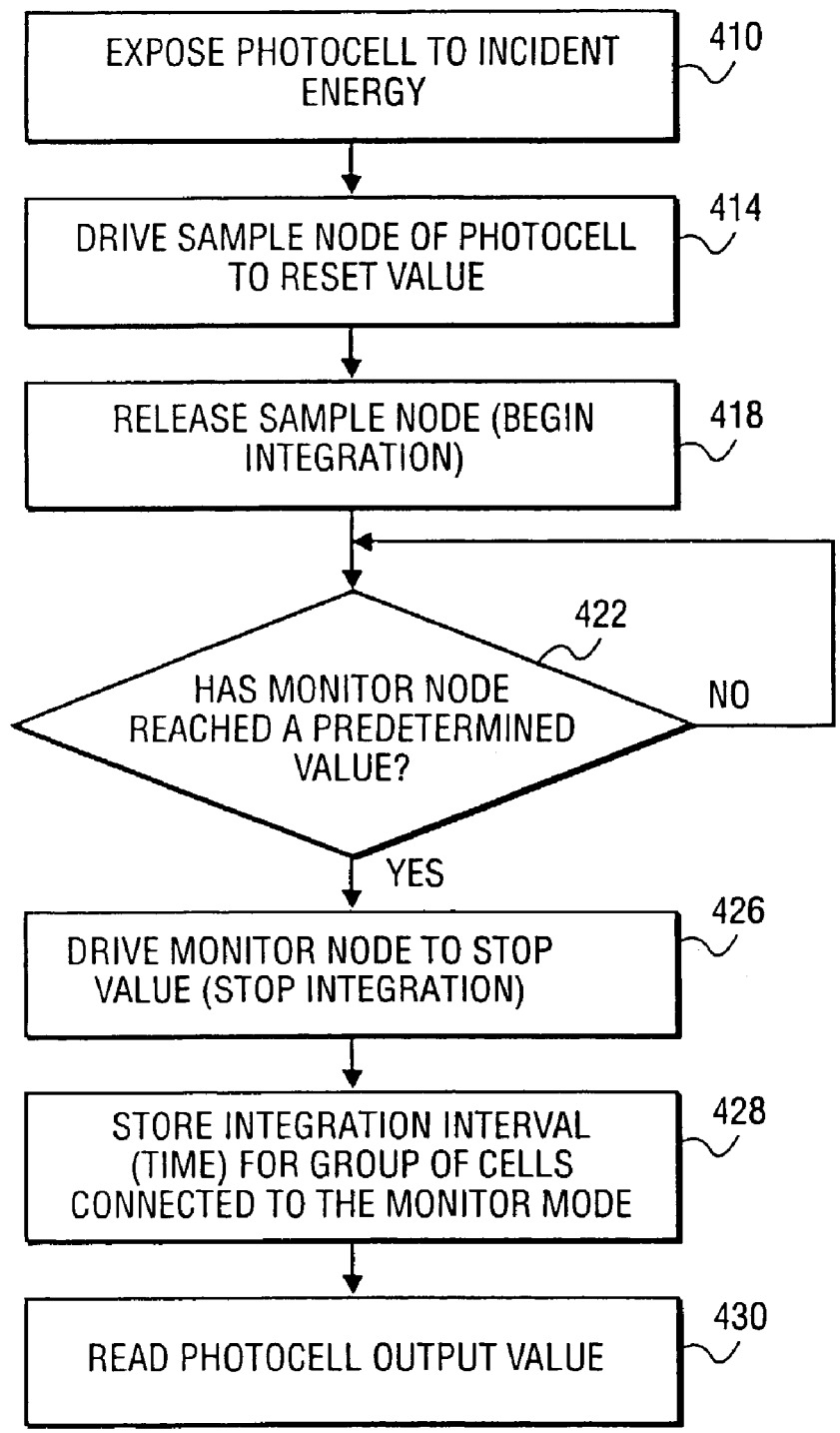
FIG. 4 is a flow diagram of steps performed according to another embodiment of the invention.
Figure 5:
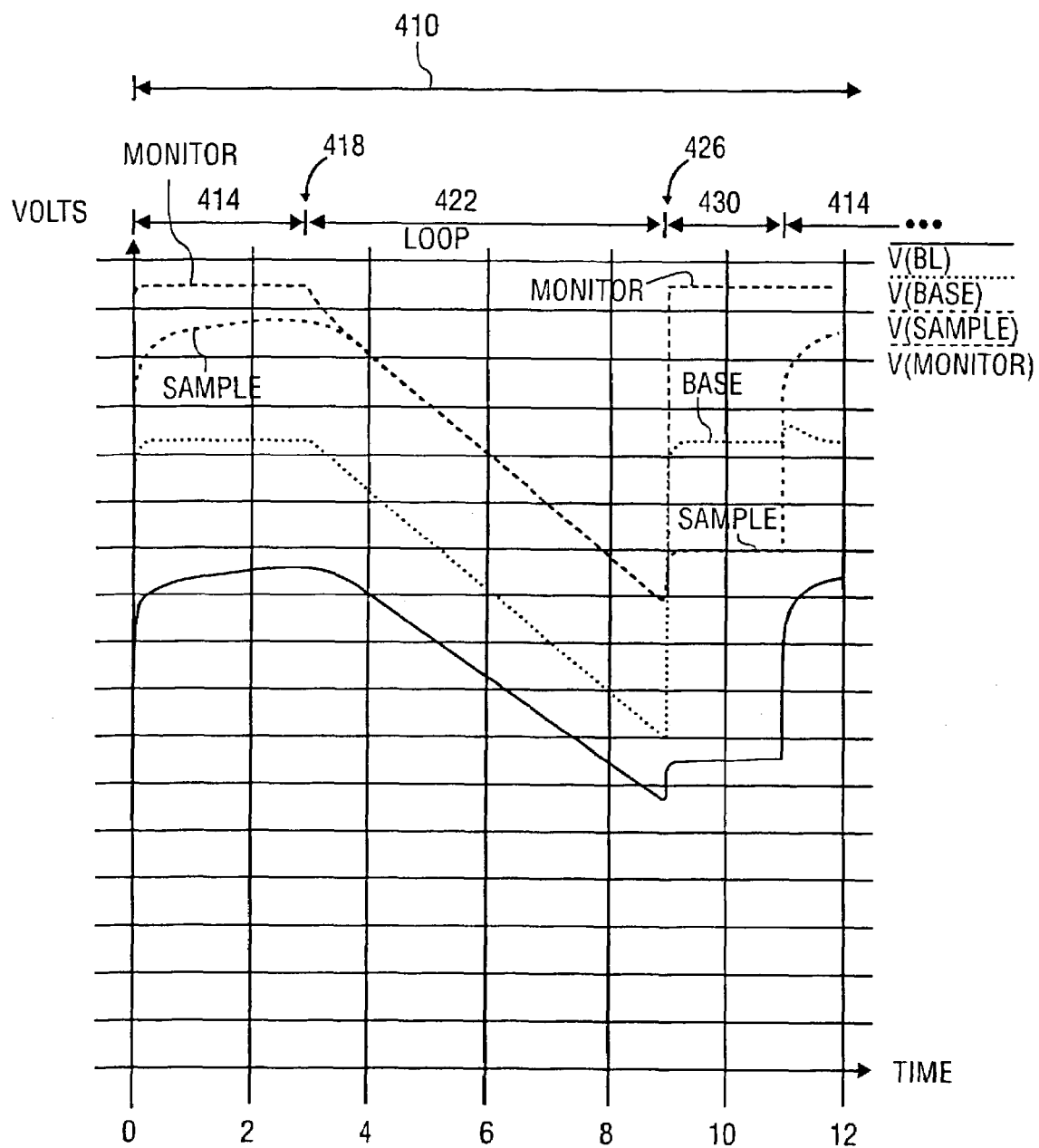
FIG. 5 illustrates various waveforms associated with operation of a photocell similar to the one in FIG. 1.

The operation of photocell 100 may be illustrated using the steps of FIG. 4 and the waveforms in FIG. 5. Operation begins in step 414 with SAMPLE being precharged to a reset value, such as one near the rail voltage $V_{DD}$ (e.g., 3.3 volts) by way of turning on transistor $M_5$. In one embodiment, $M_5$ can receive an overdriven gate voltage through signal Reset_E to mitigate body-effect in $M_5$ and drive SAMPLE to a voltage very close to $V_{DD}$. This occurs between times 0 and 2 in FIG. 5. Similarly, MONITOR is also raised to a high level by either turning on $MP_1$ in response to Reset_GE being deasserted, or by way of a separate and optional pull-up circuit and control signal (not shown). The above operations thus place the photocell 100 in its reset state. Note that step 410 of exposing the photocell to incident energy such as light may be started before or after placing the photocell in its reset state, thus not requiring a separate mechanical shutter when using the cell as part of an imaging sensor.

By time 3, the signals Reset_GE and Reset_E have been deasserted, as in step 418, thus releasing SAMPLE and beginning the integration interval. During the integration interval, the photocell is allowed translate the incident energy into an electrical signal at SAMPLE. The incident energy causes a photogenerated base current in $Q_1$ that results in lowering the base voltage of $Q_1$ towards zero (ground). $Q_1$ acts as an emitter follower in that both emitters GE and PE follow the base voltage, with the differential of $V_{BE}$ (base to emitter voltage). As the base voltage drops towards 0, both emitters GE and PE may join each other as shown in FIG. 5 and follow the base.

The control circuit CCKT monitors the voltage at MONITOR to detect when the photocell 100 is approaching saturation, as indicated in step 422. Saturation for the photocell 100 of FIG. 1 occurs when the SAMPLE voltage has dropped so low that the readout circuit RCKT can no longer follow in a faithful manner. For example, this can occur when the voltage at SAMPLE is insufficient to turn on $M_1$. Once this threshold level has been determined (either empirically or through design), CCKT may be designed to detect a voltage near such a level on MONITOR. As MONITOR is connected to the GE contact of a number of other identical cells in a group (e.g., part of a sensor array), the voltage on MONITOR will represent the cell closest to saturation.

When the MONITOR voltage reaches a predetermined level that indicates a near saturation condition, the Reset_GE signal is asserted, signifying the end of the integration interval in step 426. In the timing diagram of FIG. 5, this occurs at approximately time 9. When Reset_GE is asserted, MONITOR is driven to a stop value (e.g. near $V_{DD}$) which in turn drives the base of $Q_1$ to $V_{DD}$-$V_{BE}$ by forward biasing the GE-base junction of $Q_1$. This in turn reverse biases the PE-base junction, because the stop value is normally selected to be greater than the voltage at SAMPLE at the end of integration, thereby isolating SAMPLE (assuming that $M_5$ remains off).

Some capacitive coupling between the base and PE is observed as the SAMPLE voltage in FIG. 5 exhibits a slight jump in value at the point integration is terminated. Thus, at low levels of incident energy where the SAMPLE voltage has been driven only slightly lower than its reset value, the SAMPLE node is weakly isolated. However, the effects of this coupling may be canceled by subsequent hardware or software signal processing. In addition, increasing the capacitance of SAMPLE (e.g., larger $M_6$) may improve isolation of SAMPLE but at the expense of lower sensitivity.

In step 428, the time at which MONITOR is pulled high, and/or the integration time interval (here being 9−3=6 time units) for the group of cells connected to MONITOR is stored by the imaging system. This interval is then used to compute the energy that was incident on the group of cells after obtaining the photocell output values at BL in step 430.

After SAMPLE is isolated in step 426, the output value of the photocell may be read in step 430. This is done by reading the voltage at BL between times 9 and 11 after asserting a Cell_Readout signal. Note that the output voltage at BL will not show any saturation effects, because Reset_GE was timely asserted before the voltages at SAMPLE and MONITOR had reached their saturation level.

The photocell 100 and other variations described above may be used as part of a sensor array 600 having thousands of such cells, as illustrated in FIG. 6. The sensor array has a number of photocells $100a_1$, $100a_2$ ... $100b_1$, $100b_2$, ... arranged in rows and columns. In the embodiment shown, each column of photocells is connected to a respective monitor node $MONITOR_i$ that is controlled by a respective stop circuit $SCKT_i$ and control circuit $CCKT_i$ that may be similar to the ones described above in connection with FIG. 1. A global Reset_E signal is applied to all photocells of the array. Each column of photocells also shares a bitline, where an optical image incident on the array is represented by the photocell output signals (sensor signals) obtained through the bitlines.

The architecture of FIG. 6 permits monitoring the sensor array on a per column basis for photocells that are nearing saturation. This may be done by sensing the monitor nodes to detect a near saturation voltage level. Because of the parasitic BJT structure of $Q_1$ in each photocell of a column, the voltage on a monitor node will follow the lowest $Q_1$ base voltage in the respective column.

Once a column having a photocell that is near saturation is detected, the imaging system may terminate the integration interval for that column by asserting the Reset_GE signal for that particular column. This integration interval is then stored and used to compute the incident energy for that column. Once integration has ended for the entire sensor array 600, the sensor signals can be read through the bitlines one row at a time by asserting the appropriate wordline signal on a per row basis, where the wordline signal corresponds to the Cell_Readout signal received by the photocell of FIG. 1. The detected energy levels are then computed for the entire sensor using the integration intervals for each column, resulting in image data that is closer to the perfect image that can be obtained using the sensor.

Although FIG. 6 shows the monitor nodes being common to columns of photocells, there are alternatives which may be useful depending on the system design. One alternative is to connect the monitor nodes to rows of photocells. In that embodiment, integration is stopped on a per row basis in response to detecting a near saturation condition in a row, and the sensor signals are read one column at a time. In another embodiment, a single monitor node may be used for the entire sensor array, to detect the first photocell that is nearing saturation. Integration may then be terminated simultaneously for all photocells in the array by pulling up the monitor node.

Peripheral circuitry including the timing logic for the various control signals received by the photocells in the sensor array are not shown but they can be readily implemented by one skilled in the art. The sensor array 600 and its peripheral circuitry may be implemented using a standard CMOS logic fabrication process to implement, for instance, a single chip CMOS active pixel sensor. The stop and control circuits SCKT$_i$ and CCKT$_i$ may also be integrated on the same chip together with the sensor array 600.

Figure 7:
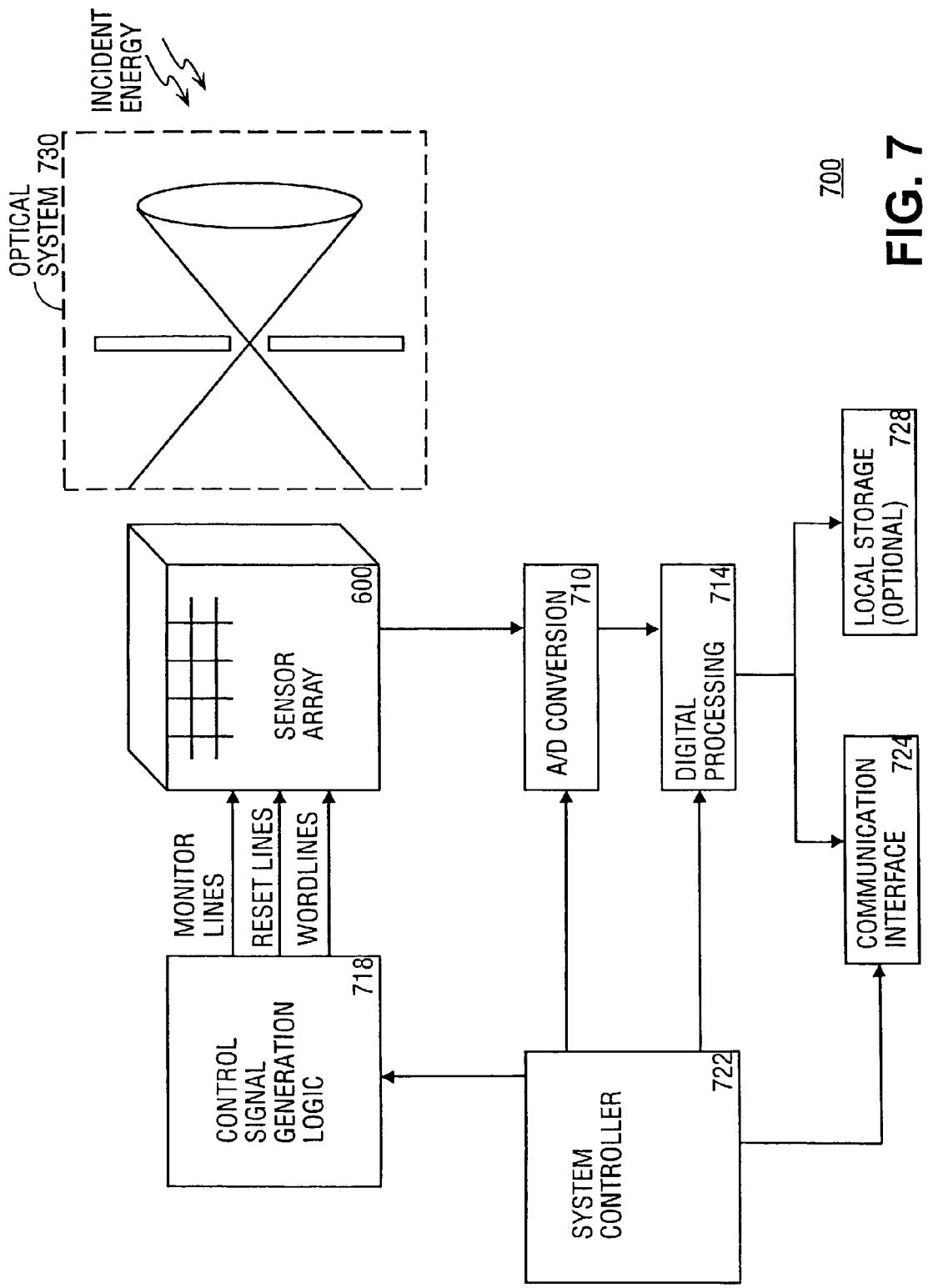
FIG. 7 shows a logical block diagram of an imaging system according to another embodiment of the invention.

The sensor array 600 and its alternatives described above may be used as part of a digital imaging system 700 shown in logical block diagram form in FIG. 7. The imaging system 700 has an optical system 730 that channels the incident energy being visible light in one case to create an optical image on the sensor array 600. Control signal generation circuitry 718 is provided to detect the signals on the monitor lines and generate the reset signals and wordlines needed to control the photocells of the sensor array 600. The output values (sensor signals) may be further processed in analog form before being fed to an A/D conversion unit 710 which in turn feeds digital processing block 714. Analog signal processing including stop and control circuits SCKT$_i$ and CCKT$_i$, the A/D unit, and portions of the digital processing block may be located on the same die as the sensor array 600. The digital processing may be done by hardwired logic and/or a programmed processor that performs a variety of digital functions, including preparing digital image data based on the sensor signals for storage or transmission.

Transmission of the image data to an external processing system may be accomplished using the communication interface 724. For instance, as a digital camera, the system 700 will contain a communication interface that implements a computer peripheral bus standard such as universal serial bus (USB) or IEEE 1394-1995. The imaging system 700 may also contain a local storage 728 of the non-volatile variety, for instance including a solid state memory such as a removable memory card, a rotating magnetic disk device, or other suitable memory device for permanent storage of digital image data. The operation of the system 700 may be orchestrated by a system controller 722 which may include a conventional microcontroller responding to instructions stored as firmware. The system controller may be programmed to respond to a detected near-saturation condition by storing the integration time values mentioned above in memory, and associating these values with the corresponding group of cells that has reached a near-saturation condition.

To summarize, the above embodiments of the invention feature a photocell 100 having a photodetecting device being a parasitic BJT that may be formed using a standard CMOS process. The parasitic device has a multi-emitter structure that allow monitoring the photocell for saturation in addition to supporting an electronic shutter mechanism, to avoid saturation while at the same time allows the full dynamic range of the photocell to be utilized. The photocell design is particularly compact which helps promote its use as part of a large sensor array.

The embodiments described above are, of course, subject to other variations in structure and implementation. For instance, the photocell 100 may be designed and built with p-channel MOSFET devices instead of the n-channel ones shown in FIG. 1. M5 may be replaced with a p-channel device formed in a p-well (assuming an n-substrate), but this may increase the size of the cell. In another variation, the photocell may be designed to operate with a dual emitter NPN structure for Q$_1$ rather than the PNP version described. Therefore, the scope of the invention should be determined not by the embodiments illustrated but by the appended claims and their legal equivalents.

What is claimed is:

1. A method of using a photocell, comprising:

exposing the photocell to incident light;

driving a sample node of the photocell to a first reset value at a first time via a first reset signal;

driving a monitor node of the photocell to a second reset value at the first time via a second reset signal that differs from the first reset signal, wherein the second reset value differs from the first reset value;

sensing the monitor node of the photocell, wherein signal values of the monitor and sample nodes decay in response to the incident light; and driving the monitor node to a stop value at a second time in response to the signal value of the monitor node having decayed to a predetermined value, wherein the first time differs from the second time.

2. The method of claim 1 further comprising:

releasing the sample node after driving the sample node to the first reset value;

storing a first time value corresponding to the point in time of releasing the sample node; and storing a second time value corresponding to the point in time of driving the monitor node to the stop value.

3. The method of claim 1 wherein exposing the photocell is started before driving the sample node to the first reset value.

4. The method of claim 1 further comprising:

reading an output value for the photocell, related to the signal value of the sample node, after driving the monitor node to the stop value.

5. The method of claim 1 further comprising selecting the stop value to be greater than a voltage at the sample node when the signal value of the monitor node has decayed to the predetermined value.

6. The method of claim 1 further comprising integrating the signal value of the sample node until the monitor node is driven to the stop value.

7. The method of claim 1 wherein the second time follows the first time.

8. The method of claim 7 further comprising driving the sample node to the first reset value at a third time for an immediately subsequent charge collection operation, wherein the third time follows the second time.

9. A method of using a photocell, comprising exposing the photocell to incident light;

driving a sample node of the photocell to a reset value at a first time during a first charge collection operation;

translating the incident light to a first signal value at the sample node;

determining that the photocell is approaching saturation based on the first signal value dropping below a first predetermined value;

sensing a monitor node of the photocell, wherein signal values of the monitor and sample nodes decay in response to the incident light;

driving the monitor node to a stop value at a second time during the first charge collection operation after driving the sample node to the reset value at the first time in response to a second signal value of the monitor node having decayed to a second predetermined value that is within a predetermined range of the first predetermined value; and driving the sample node to the reset value at a third time during a second charge collection operation that immediately follows the first charge collection operation, wherein the first time, the second time and the third time differ.

10. The method of claim 9 further comprising:
releasing the sample node after driving the sample node to the reset value;
storing a first time value corresponding to the point in time of releasing the sample node; and
storing a second time value corresponding to the point in time of driving the monitor node to the stop value.

11. The method of claim 9 wherein exposing the photocell is started before driving the sample node to the reset value.

12. The method of claim 9 further comprising:
reading an output value for the photocell, related to the signal value of the sample node, after driving the monitor node to the stop value.

13. The method of claim 9 further comprising integrating the first signal value until the monitor node is driven to the stop value.

* * * * *